United States Patent
Kim et al.

(10) Patent No.: US 7,507,992 B2
(45) Date of Patent: Mar. 24, 2009

(54) LIQUID CRYSTAL DISPLAY DEVICE INCLUDING THIN FILM TRANSISTORS HAVING DIFFERENT PARACITIC CAPACITANCE

(75) Inventors: Do-Yeon Kim, Busan (KR); Jeong-Hoon Ko, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 51 days.

(21) Appl. No.: 11/315,122

(22) Filed: Dec. 23, 2005

(65) Prior Publication Data

US 2006/0290630 A1   Dec. 28, 2006

(30) Foreign Application Priority Data

Jun. 28, 2005   (KR) .................. 10-2005-0056096

(51) Int. Cl.
H01L 29/04 (2006.01)
H01L 29/10 (2006.01)
H01L 31/00 (2006.01)

(52) U.S. Cl. ................. 257/59; 257/72; 349/141
(58) Field of Classification Search ................ 257/59, 257/401

See application file for complete search history.

(56) References Cited

U.S. PATENT DOCUMENTS

| | | | | |
|---|---|---|---|---|
| 5,532,180 A | * | 7/1996 | den Boer et al. | 438/30 |
| 5,650,358 A | * | 7/1997 | Gu et al. | 438/30 |
| 5,854,100 A | * | 12/1998 | Chi | 438/202 |
| 6,023,074 A | * | 2/2000 | Zhang | 257/59 |
| 6,952,244 B2 | * | 10/2005 | Cairns et al. | 349/43 |
| 2001/0030719 A1 | * | 10/2001 | Yamaguchi et al. | 349/43 |
| 2003/0016310 A1 | * | 1/2003 | Lee | 349/43 |

* cited by examiner

Primary Examiner—Jerome Jackson, Jr.
Assistant Examiner—Anthony Ho
(74) Attorney, Agent, or Firm—Morgan Lewis & Bockius LLP

(57) ABSTRACT

A liquid crystal display device includes a first pixel and a second pixel. The first pixel includes a first thin film transistor having a first channel W/L (width/length) ratio and a first gate-drain parasitic capacitance. The second pixel includes a second thin film transistor that is disposed at a different relative position than the first thin film transistor. The second thin film transistor has a second channel W/L (width/length) ratio and a second gate-drain parasitic capacitance. The first and second channel W/L ratios are substantially the same, and the first and second gate-drain parasitic capacitances are different from each other such that the first and second pixels have substantially the same common voltages.

12 Claims, 6 Drawing Sheets

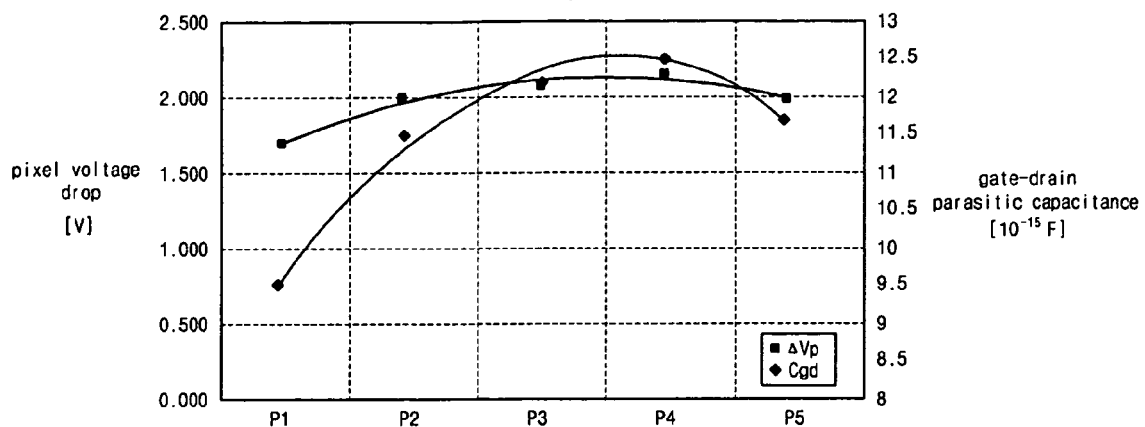
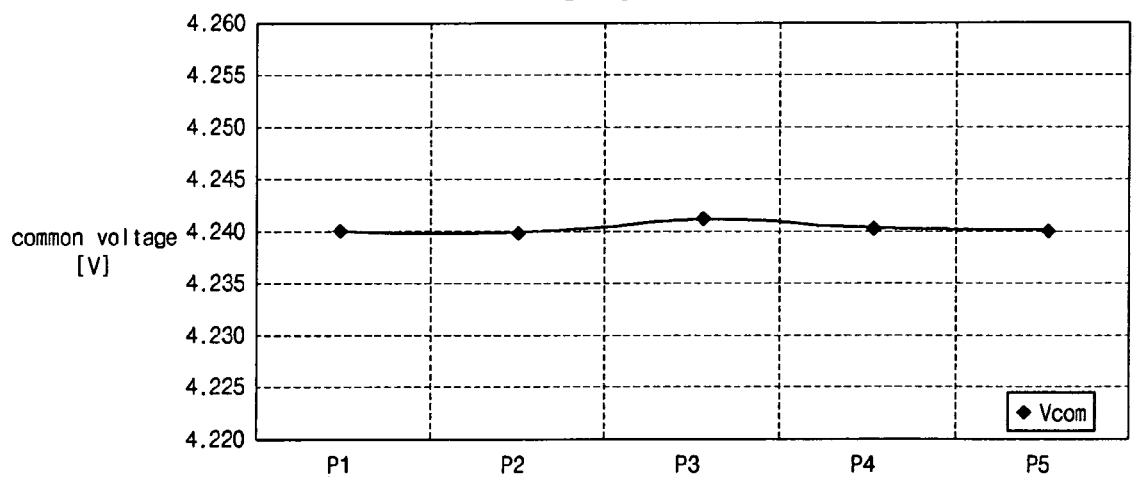

LIQUID CRYSTAL DISPLAY DEVICE INCLUDING THIN FILM TRANSISTORS HAVING DIFFERENT PARACITIC CAPACITANCE

The present invention claims the benefit of Korean Patent Application No. 2005-0056096, filed in Korea on Jun. 28, 2005, which is hereby incorporated by reference.

BACKGROUND OF THE INVENTION

1. Field of the Invention

The present invention relates to a liquid crystal display device.

2. Discussion of the Related Art

Until recently, display devices have typically used cathode-ray tubes (CRTs). Presently, much effort has been made to develop various types of flat panel displays, such as liquid crystal display (LCD) devices, plasma display panels (PDPs), field emission displays, and electro-luminescence displays (ELDs), as substitutes for CRTs. Of these flat panel displays types, LCD devices have many advantages, such as high resolution, light weight, thin profile, compact size, and low power supply requirements.

In general, an LCD device includes two substrates that are spaced apart and facing each other with a liquid crystal layer interposed between the two substrates. The two substrates include electrodes that face each other such that a voltage applied between the electrodes induces an electric field across the liquid crystal layer. Alignment of the liquid crystal molecules in the liquid crystal layer changes in accordance with the intensity of the induced electric field into direction of the induced electric field, thereby changing the light transmissivity of the LCD device. Thus, the LCD device displays images by varying the intensity of the induced electric field.

FIG. 1 is a circuit diagram illustrating an LCD device according to the related art.

As illustrated in FIG. 1, in the related art LCD device 10, a plurality of pixels "P" are arranged in a matrix form. The pixels "P" are connected to a plurality of gate and data lines "GL" and "DL." In addition, in each pixel "P," a thin film transistor (TFT) "T" connected to the corresponding gate and data lines "GL" and "DL," and a liquid crystal capacitor "$C_{LC}$" and a storage capacitor "$C_{ST}$" connected to the TFT "T" are arranged.

A gate electrode of the TFT "T" is connected to the gate line "GL," and a source electrode of the TFT "T" is connected to the data line "DL." A pixel electrode, a common electrode, and a liquid crystal layer between the pixel and common electrodes form the liquid crystal capacitor "$C_{LC}$." The pixel electrode is connected to a drain electrode of the TFT "T" and applied with a pixel voltage (Vp). The common electrode is applied with a common voltage (Vcom). The storage capacitor "$C_{ST}$" is connected in parallel with the liquid crystal capacitor "$C_{LC}$."

During one frame, the gate lines "GL" are sequentially scanned, and the scanned gate line "GL" is applied with an on gate voltage (Vg). Accordingly, the TFT "T" connected to the scanned gate line "GL" is turned on and a channel of the TFT "T" is open. When the channel is open, a data voltage (Vd) is applied to the data line "DL." The data voltage (Vd) passes though the open channel, and thus, the pixel electrode is charged with the pixel voltage (Vp). Since the common electrode is applied with the common voltage (Vcom), a liquid crystal voltage, which is a voltage difference between the pixel voltage (Vp) and the common voltage (Vcom), is charged in the liquid crystal capacitor "$C_{LC}$." An electric field induced by the liquid crystal voltage changes the alignment of the liquid crystal molecules in the liquid crystal layer.

When the gate line "GL" is applied with an off gate voltage (Vg), the channel of the TFT "T" is close and the pixel voltage (Vp) is maintained. The storage capacitor "$C_{ST}$" prevents a drop of the pixel voltage (Vp).

All pixels of FIG. 1 have the same structure and, therefore, have the same electrical properties. Since all pixels have the same electrical properties, they can be operated in the same manner. Accordingly, all TFTs "T," which are main elements in determining the electrical properties, have the same structures.

FIG. 2 is a plan view illustrating the TFT of FIG. 1.

As illustrated in FIG. 2, the related art TFT "T" includes a gate electrode 25, a semiconductor layer 40 on the gate electrode 25, and source/drain electrodes 35, 37 on the semiconductor layer 40 and apart from each other. The source electrode 35 is connected to the data line "DL." The gate electrode 25 is a portion of the gate line "GL" corresponding to the semiconductor layer 40. Although not shown in FIG. 2, the drain electrode 37 is connected to the pixel electrode.

A ratio of a width "W" and a length "L" (W/L ratio) of a channel "CH" and a gate-drain parasitic capacitance (Cgd) between the gate electrode 25 and the drain electrode 37 are main aspects of the electrical properties of the TFT "T." As explained above, the related art TFTs "T" have the same structures in all pixels (P of FIG. 1). Accordingly, the W/L ratios of the channel "CH" and the gate-drain parasitic capacitances (Cgd) are the same in all TFTs "T." The W/L ratio influences an on current in the channel "CH," which is proportional to the W/L ratio. The gate-drain parasitic capacitance (Cgd) is generated by an overlap of the gate electrode 25 and the drain electrode 37. The gate-drain parasitic capacitance (Cgd) causes the pixel voltage (Vp) to drop. A relation of the drop of the pixel voltage ($\Delta Vp$) with respect to the gate-drain parasitic capacitance (Cgd) is expressed by, $\Delta Vp = Cgd/(Clc+Cst+Cgd)*\Delta Vg$ (Clc is a liquid crystal capacitance, Cst is a storage capacitance, and $\Delta Vg$ is expressed by Vgh (high gate voltage)–Vgl (low gate voltage)). In other words, the pixel voltage drop ($\Delta Vp$) is proportional to the gate-drain parasitic capacitance (Cgd).

Since the W/L ratios and the gate-drain parasitic capacitances in all related art TFTs "T" are uniform, all related art TFTs "T" have the same electric properties. However, since the process deviation is generated during actual fabrication of the LCD device, non-uniformity of the electric properties occurs. For example, when fabricating the TFTs "T," thickness deviation of a thin film of the TFT "T" between the TFTs "T" at different pixel positions is actually generated. Due to the process deviation, electrical property deviation is caused. Therefore, deviation in the pixel voltage drop (d$\Delta Vp$) between the related art pixels is caused according to pixel positions.

In addition, the gate and data voltages (Vg and Vd) are transmitted from one end to the other end of the gate and data lines (GL and DL), respectively. Accordingly, voltages are sufficiently applied to pixels adjacent to the one ends of the lines, but are not sufficiently applied to pixels adjacent to the other ends due to resistance-capacitance (RC) delay of the lines. Therefore, the deviation in the pixel voltage drop (d$\Delta Vp$) between the related art pixels is caused according to pixel positions.

FIG. 3 is a graph illustrating the distribution of pixel voltage drop quantities measured at various positions of the related art LCD device. First to fifth pixels "P1" to "P5" are pixels at first to fifth positions "LP1" to "LP5" of FIG. 1 along left to right sides of the LCD device. In other words, the first pixel "P1" is disposed adjacent to the one side of the gate line applied with the gate voltage (Vg), the fifth pixel "P5" is disposed adjacent to the other side of the gate line, and the third pixel "P3" is disposed adjacent at a center portion of the gate line. The second pixel "P2" is disposed between the first and third pixels "P1" and "P3," and the fourth pixel "P4" is disposed between the fifth and third pixels "P5" and "P3."

As illustrated in FIG. 3, the pixels "P1" to "P5" at different positions "LP1" to "LP5" have different pixel voltage drops ($\Delta Vp$), and thus, deviation in the pixel voltage drop ($d\Delta Vp$) of the pixels "P1" to "P5" is generated. Accordingly, common voltages (Vcom) required to normally operate the pixels "P1" to "P5" also have a deviation. For example, the first pixel "P1," which has a pixel voltage drop ($\Delta Vp$) greater than the other pixels "P2" to "P5," requires a common voltage (Vcom) less than the other pixels "P2" to "P5." In contrast, the fourth pixel "P4," which has a pixel voltage drop ($\Delta Vp$) less than the other pixels "P1" to "P3" and "P5," requires a common voltage (Vcom) greater than the other pixels "P1" to "P3" and "P5." Therefore, according to the pixel positions, distribution of the common voltages (Vcom) required for normal pixel operation is non-uniform and inversely proportional to the distribution of the pixel voltage drop ($\Delta Vp$).

However, since the same common voltage is applied to the pixels "P1" to "P5," most pixels are applied with a common voltage that is different from the common voltage needed for normal operation. Therefore, most pixels are operated improperly. As a result, flicker and afterimage are generated, thereby degrading image quality.

SUMMARY OF THE INVENTION

Accordingly, the present invention is directed to a liquid crystal display device that substantially obviates one or more of problems due to limitations and disadvantages of the related art.

An object of the present invention is to provide a liquid crystal display device that has improved display image quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a first pixel including a first thin film transistor, the first thin film transistor having a first channel W/L (width/length) ratio and a first gate-drain parasitic capacitance; and a second pixel including a second thin film transistor, the second thin film transistor being disposed at a different relative position than the first thin film transistor, the second thin film transistor having a second channel W/L (width/length) ratio and a second gate-drain parasitic capacitance, wherein the first and second channel W/L ratios are substantially the same, and the first and second gate-drain parasitic capacitances are different from each other such that the first and second pixels have substantially the same common voltages.

In another aspect, a liquid crystal display device includes a plurality of pixels along a gate line; and a plurality of thin film transistors disposed in respective ones of the plurality of pixels, each thin film transistor having a channel W/L ratio and a gate-drain parasitic capacitance, wherein the W/L ratios of the plurality of thin film transistors are substantially the same, and the gate-drain parasitic capacitances of the plurality of thin film transistors have a non-uniform distribution such that the plurality of pixels substantially have the same common voltages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 4 is a graph illustrating the distribution of pixel voltage drops and gate-drain parasitic capacitances measured at various positions of an LCD device according to an exemplary embodiment of the present invention;

FIG. 5 is a graph illustrating the distribution of common voltages measured for normal pixel operation having the pixel voltage drops of FIG. 4;

DETAILED DESCRIPTION OF THE PREFERRED EMBODIMENTS

Reference will now be made in detail to the illustrated embodiments of the present invention, which are illustrated in the accompanying drawings.

FIG. 4 is a graph illustrating the distribution of pixel voltage drops and gate-drain parasitic capacitances measured at various positions of an LCD device according to an exemplary embodiment of the present invention, and FIG. 5 is a graph illustrating the distribution of common voltages measured for normal operation using the pixel voltage drops of FIG. 4.

Figure 1:
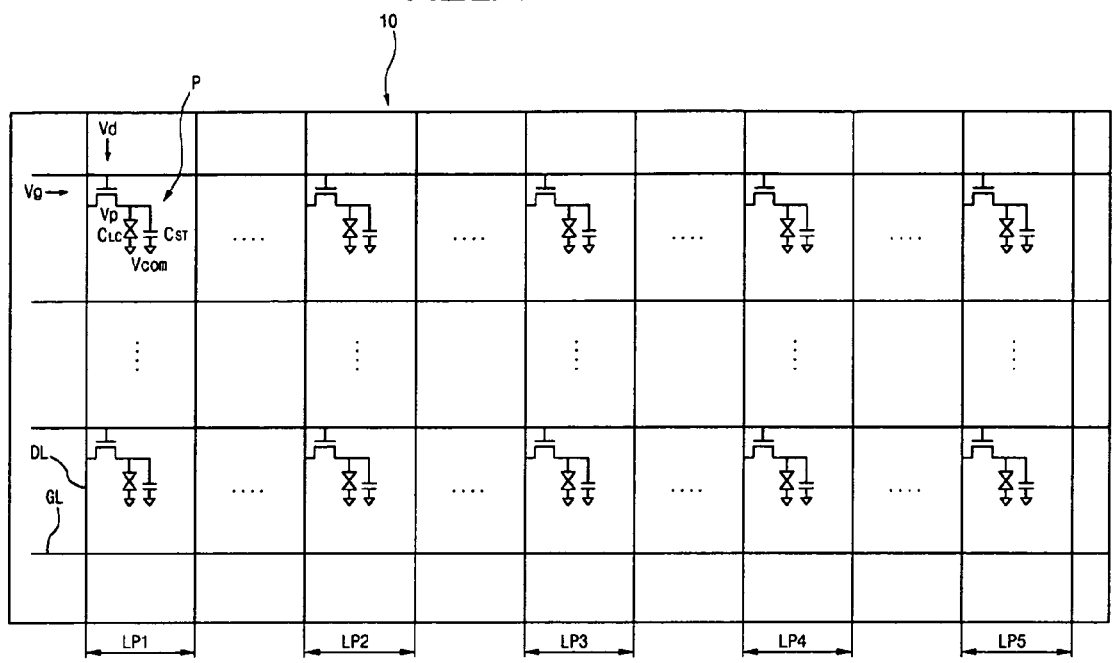
FIG. 1 is a circuit diagram illustrating an LCD device according to the related art.
Figure 2:
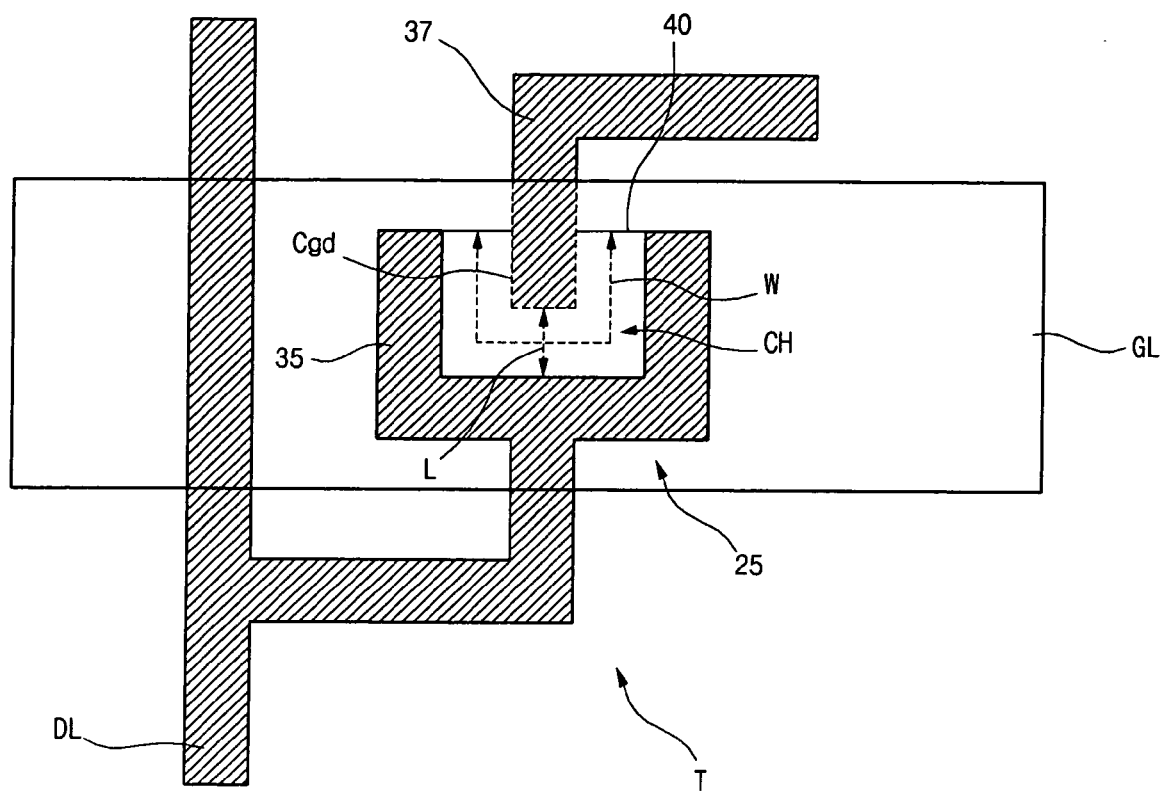
FIG. 2 is a plan view illustrating the TFT of FIG. 1.

First to fifth pixels "P1" to "P5" of FIG. 4 correspond to the first to fifth pixels of FIG. 1, respectively. In other words, the first pixel "P1" is disposed adjacent to the one side of the gate line (GL of FIG. 1) applied with the gate voltage (Vg), the fifth pixel "P5" is disposed adjacent to the other side of the gate line, and the third pixel "P3" is disposed adjacent to a center portion of the gate line. The second pixel "P2" is disposed between the first and third pixels "P1" and "P3," and the fourth pixel "P4" is disposed between the fifth and third pixels "P5" and "P3."

In the exemplary embodiment, TFTs in the LCD device are fabricated such that the pixels have a distribution of the gate-drain parasitic capacitances (Cgd) as shown in FIG. 4. This distribution of the gate-drain parasitic capacitances (Cgd) optimizes the deviation in the pixel voltage drop (dΔVp). According to the distribution of the gate-drain parasitic capacitances (Cgd), the pixel voltage drops (ΔVp) have a distribution as shown in FIG. 4. According to the distribution of the pixel voltage drops (ΔVp), the common voltages (Vcom) required for normal operation of the pixels are substantially uniform, as shown in FIG. 5. In other words, in the exemplary embodiment, the pixel voltage drops (ΔVp) are adjusted by adjusting the gate-drain parasitic capacitances (Cgd) such that the common voltages (Vcom) applied to all pixels have a substantially uniform distribution.

Figure 3:
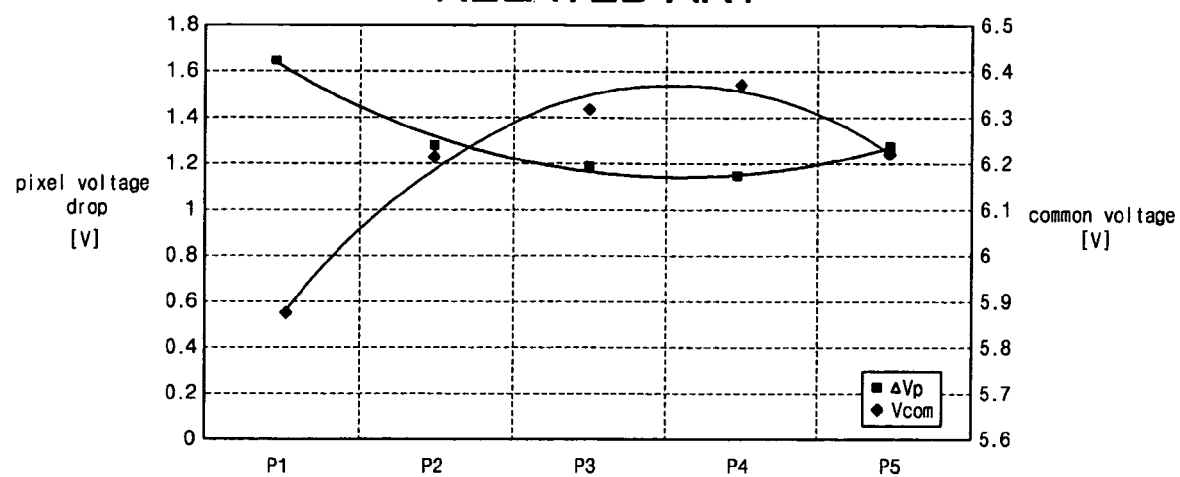
FIG. 3 is a graph illustrating the distribution of pixel voltage drops measured at positions of the related art LCD device.

With reference to FIG. 3 of the related art, the distribution of the pixel voltage drops (ΔVp) has a concave shape along the gate line, and the distribution of the common voltages (Vcom) has a convex shape to normally operate the pixels. Accordingly, based on the related art distributions, to find a uniform distribution of the common voltages (Vcom), the distributions of the common voltages (Vcom) are measured while the distribution of the pixel voltage drops (ΔVp) is changed upward such that this distribution has a shape opposite to the concave shape. By measuring the distributions of the common voltages (Vcom), the distribution of the pixel voltage drops (ΔVp) to achieve a uniform distribution of the common voltages (Vcom) is found.

When finding the distribution of the pixel voltage drops (ΔVp) to make the distribution of the common voltages (Vcom) uniform, the gate-drain parasitic capacitances (Cgd) of all pixels are separately adjusted according to the found distribution of the pixel voltage drops (ΔVp). In other words, based on the expression, ΔVp=Cgd/(Clc+Cst+Cgd)*ΔVg, the gate-drain parasitic capacitances (Cgd) are adjusted to obtain the pixel voltage drops (ΔVp) required according to pixel positions of the LCD device.

For example, regarding the first pixel "P1" having the greatest pixel voltage drop (ΔVp) of the pixels as shown in FIG. 3, the gate-drain capacitance (Cgd) of the first pixel "P1" is adjusted to have the least value among the pixels. In contrast, regarding the fourth pixel "P4" relatively having the least pixel voltage drop (ΔVp) of the pixels as shown in FIG. 3, the gate-drain capacitance (Cgd) of the fourth pixel "P4" is adjusted to have the greatest value among the pixels. In this manner, to compensate for the relative difference of the pixel voltage drops (ΔVp) among the pixels, the gate-drain parasitic capacitances (Cgd) of the pixels are adjusted accordingly. Therefore, the deviation in the pixel voltage drop between the pixels at different positions can be optimized. To adjust the distribution of the pixel voltage drop of FIG. 3 into the distribution of the pixel voltage drop quantities of FIG. 4, the gate-drain parasitic capacitances are adjusted to have relative difference between the pixels.

As a result, in the exemplary embodiment, to substantially obtain the uniform common voltages for normal operation of the pixels such that flicker and afterimage cannot be perceived, the TFTs are fabricated such that the gate-drain parasitic capacitances have the deviation according to pixel positions. Meanwhile, although the gate-drain parasitic capacitances are relatively adjusted, the W/L ratios of the TFTs are uniformly maintained.

Figure 6:
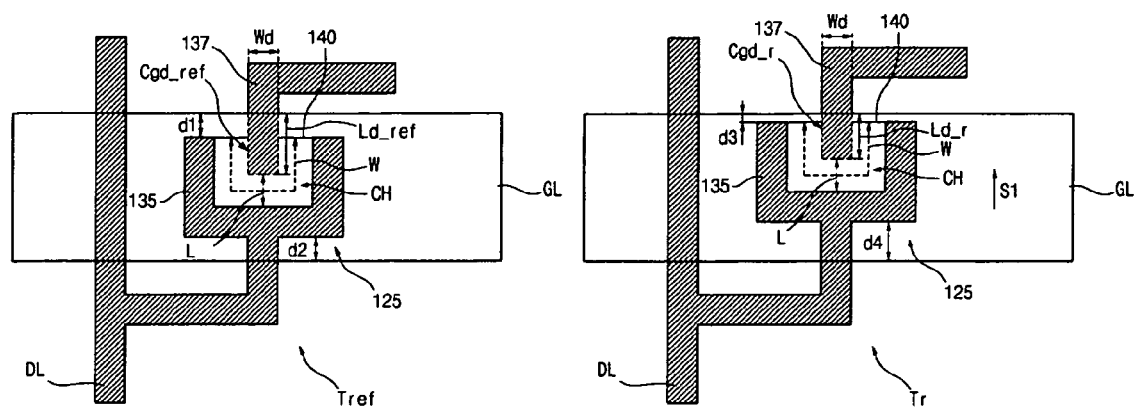
FIG. 6 is a plan view illustrating two TFTs having gate-drain parasitic capacitances deviated from each other according to a first exemplary embodiment of the present invention.

Hereinafter, a method of designing the TFTs for the gate-drain parasitic capacitances to have the deviation according to pixel positions will be explained in detail. FIG. 6 shows a plan view illustrating two TFTs having gate-drain parasitic capacitances deviated from each other according to a first exemplary embodiment of the present invention. As shown in FIG. 6, a left TFT represents a TFT having the greatest gate-drain parasitic capacitance of FIG. 4 and designated as a reference TFT, and a right TFT is one of the TFTs other than the reference TFT.

As illustrated in FIG. 6, each of the left and right TFTs "Tref" and "Tr" includes a gate electrode 125, a semiconductor layer 140 on the gate electrode 125, and source and drain electrodes 135 and 137 on the semiconductor layer 140 and spaced apart from each other. The source electrode 135 is connected to the data line "DL." The gate electrode 125 is a portion of the gate line "GL" corresponding to the semiconductor layer 140. The gate and data lines "GL" and "DL" cross each other to define a pixel region. Although not shown in FIG. 6, the drain electrode 137 is connected to a pixel electrode in the pixel region, and a gate insulator is disposed between the semiconductor layer 140 and the gate electrode 125.

In each of the left and right TFTs "Tref" and "Tr," the source electrode 135 has an U-shape such that an inner space thereof is open upward. The drain electrode 137 is extended in the inner space of the source electrode 135. The semiconductor layer 140 between the source and drain electrodes 135 and 137 is defined as a channel "CH." The drain electrodes 137 and the gate electrodes 125 overlap each other to define left and right parasitic capacitances "Cgd_ref" and "Cgd_r."

The right source and drain electrodes 135 and 137 are disposed at a position shifted from the left source and drain electrodes 135 and 137 by a first shift distance "S1." In other words, a third distance "d3" between the upsides of the right source and gate electrodes 135 and 125 is equal to a shift distance "S1" subtracted from a first distance "d1" between the upsides of the left source and gate electrodes 135 and 125. Likewise, a fourth distance "d4" between the downsides of the right source and gate electrodes 135 and 125 is, equal to a shift distance "S1" added to a second distance "d2" between the downsides of the left source and gate electrodes 135 and 125. The first shift distance "S1" is equal to or less than the first distance "d1".

When the right source and drain electrodes 135 and 137 are shifted such that the right source electrode 135 is disposed within the right gate electrode 125, the W/L ratios of the left and right TFTs "Tref" and "Tr" are substantially the same. In other words, since the right source electrode 135 is shifted within the right gate electrode 125, the left and right channels "CH" have the same area. Accordingly, the left and right W/L ratios are the same. Therefore, the left and right TFTs "Tref" and "Tr" have the same channel properties, for example, the same on current.

Meanwhile, since the right drain electrode 137 is shifted upward, the right gate-drain parasitic capacitance (Cgd_r) is less than the left gate-drain parasitic capacitance (Cgd_ref). In other words, when the drain electrode 137 has a constant drain width "Wd," the right drain width "Wd" overlapped between the right drain and gate electrodes 137 and 125 is the same as the left drain width "Wd" overlapped between the left drain and gate electrodes 137 and 125. However, the right drain length "Ld_r" overlapped between the right drain and gate electrodes 137 and 125 is less than the left drain length "Ld_ref" overlapped between the left drain and gate electrodes 137 and 125. Accordingly, a right area overlapped between the right drain and gate electrodes 137 and 125 is less than a left area overlapped between the left drain and gate electrodes 137 and 125. Therefore, the right gate-drain parasitic capacitance (Cgd_r) is less than the left gate-drain parasitic capacitance (Cgd_ref).

As explained above, in the first exemplary embodiment, as the source and drain electrodes are shifted upward such that the W/L ratios of the channels remains uniform, the gate-drain parasitic capacitances can be adequately adjusted according to the pixel positions. Therefore, the gate-drain parasitic capacitances, as shown in FIG. 4, can be obtained effectively, and thus, the uniform distribution of the common voltages required for the pixels, as shown in FIG. 5, can be obtained.

In the first exemplary embodiment, the TFT having the greatest gate-drain parasitic capacitance is used as a reference TFT, and the gate-drain parasitic capacitances of the other TFTs are adjusted. Accordingly, the gate-drain parasitic capacitances of the other TFTs are adjusted to have a value less than the reference gate-drain parasitic capacitance.

Figure 7:
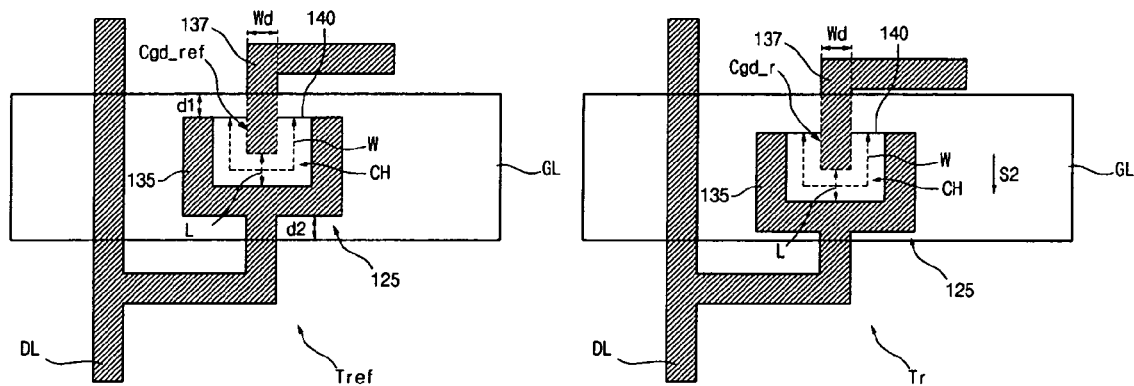
FIG. 7 is a plan view illustrating two TFTs having gate-drain parasitic capacitances deviated from each other according to a second exemplary embodiment of the present invention.

In a second exemplary embodiment, in contrast to the first exemplary embodiment, the TFT having the least gate-drain parasitic capacitance is used as a reference TFT. FIG. 7 is a plan view illustrating two TFTs having gate-drain parasitic capacitances deviated from each other according to a second exemplary embodiment of the present invention. As shown in FIG. 7, a left TFT represents a TFT having the least gate-drain parasitic capacitance of FIG. 4 and designated as a reference TFT, and a right TFT is one of the TFTs other than the reference TFT.

As illustrated in FIG. 7, in a second exemplary embodiment, in contrast to the first exemplary embodiment, the TFT having the least gate-drain parasitic capacitance is used as a reference TFT. Accordingly, the source and drain electrodes 135 and 137 of the right TFT "Tr" are shifted downward by a second shift distance "S2" with respect to a position of the source and drain electrodes 135 and 137 of the left TFT "Tref." The second shift distance "S2" is limited within a range such that the left and right W/L ratios substantially remain the same, similarly to the first shift distance (S1 of FIG. 6). In other words, the second shift distance "S2" is equal to or less than a second distance "d2" between the downsides of the left source and gate electrodes 135 and 125.

In the second exemplary embodiment, as the right drain electrode 137 is shifted downward, an area overlapped between the right drain and gate electrodes 137 and 125 is more than an area overlapped between the left drain and gate electrodes 137 and 125. Accordingly, the right gate-drain parasitic capacitance (Cgd_r) is greater than the left gate-drain parasitic capacitance (Cgd_ref).

As explained above, in the second exemplary embodiment, as the source and drain electrodes are shifted downward such that the W/L ratios of the channels remains uniform, the gate-drain parasitic capacitances can be adequately adjusted according to the pixel positions. Therefore, the gate-drain parasitic capacitances, as shown in FIG. 4, can be obtained effectively, and thus, the uniform distribution of the common voltages required for the pixels, as shown in FIG. 5, can be obtained.

In the first and second exemplary embodiments, the TFT having the greatest or the least gate-drain parasitic capacitance is used as a reference TFT, and the gate-drain parasitic capacitances of the other TFTs are adjusted. A following third exemplary embodiment combines the first and second exemplary embodiments.

Figure 8:
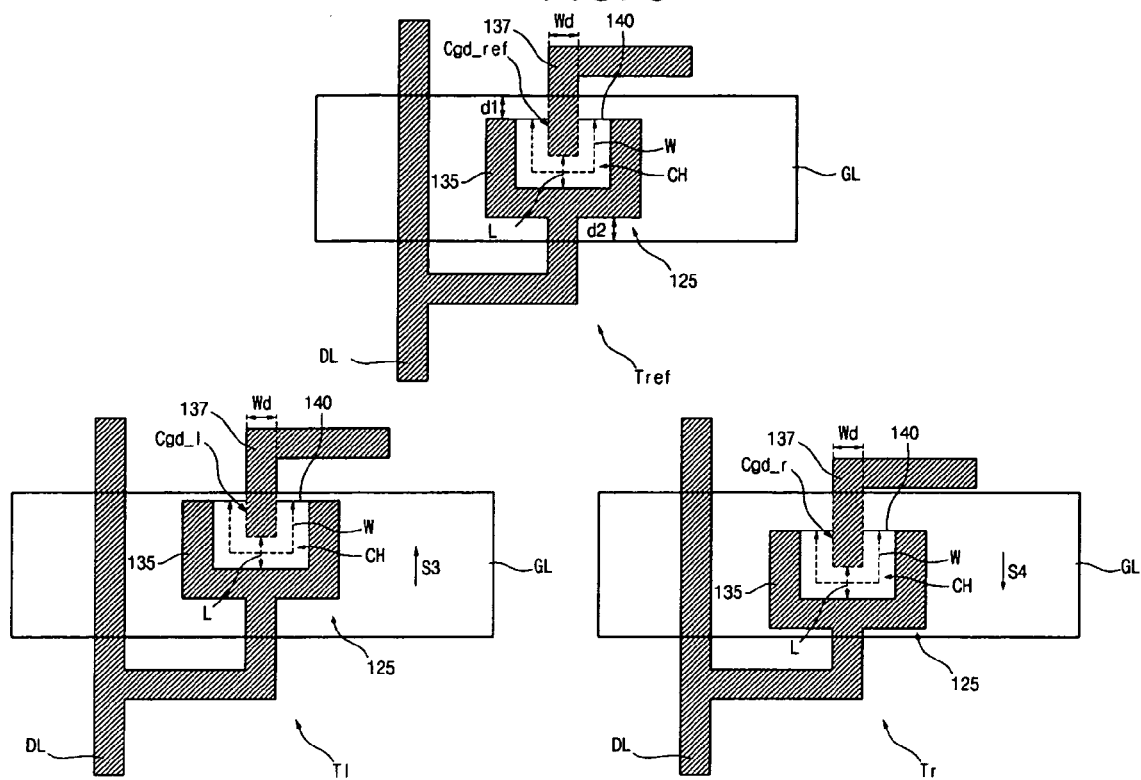
FIG. 8 is a plan view illustrating three TFTs having gate-drain parasitic capacitances deviated from one another according to a third exemplary embodiment of the present invention.

FIG. 8 is a plan view illustrating three TFTs having gate-drain parasitic capacitances deviated from one another according to a third exemplary embodiment of the present invention. As shown in FIG. 8, an upper center TFT represents a TFT having the gate-drain parasitic capacitance between the greatest and the least gate-drain parasitic capacitances of FIG. 4 and designated as a reference TFT, the left TFT represents a TFT having the gate-drain parasitic capacitance less than the reference gate-drain parasitic capacitance, and the right TFT represents a TFT having the gate-drain parasitic capacitance more than the reference gate-drain parasitic capacitance.

As illustrated in FIG. 8, in a third exemplary embodiment, methods of adjusting the gate-drain parasitic capacitance in the first and second exemplary embodiments are combined. That is, the TFT having the gate-drain parasitic capacitance between the most and least gate-drain parasitic capacitances of FIG. 4 is used as a reference TFT. Accordingly, the source and drain electrodes 135 and 137 of the left TFT "Tl" are shifted upward by a third shift distance "S3" such that the left gate-drain parasitic capacitance (Cgd_l) is less than the reference gate-drain parasitic capacitance (Cgd_ref), and the source and drain electrodes 135 and 137 of the right TFT "Tr" are shifted downward by a fourth shift distance "S4" such that the right gate-drain parasitic capacitance (Cgd_r) is more than the reference gate-drain parasitic capacitance (Cgd_ref). The third and fourth shift distances "S3" and "S4" are limited within a range that the left, right, and reference W/L ratios substantially remain the same. In other words, the third shift distance "S3" is equal to or less than a first distance "d1" between the upsides of the reference source and gate electrodes 135 and 125, and the fourth shift distance "S4" is equal to or less than a second distance "d2" between the downsides of the reference source and gate electrodes 135 and 125.

In the third exemplary embodiment, as the left and right drain electrodes 137 are shifted upward and downward, respectively, the left gate-drain parasitic capacitance (Cgd_l) is less than the reference gate-drain parasitic capacitance (Cgd_ref) and the right gate-drain parasitic capacitance (Cgd_r) is more than the reference gate-drain parasitic capacitance (Cgd_ref).

As explained above, in the third exemplary embodiment, as the source and drain electrodes are shifted upward and downward within an extent such that the W/L ratios of the channels remain uniform, the gate-drain parasitic capacitances can be adequately adjusted according to the pixel positions. Therefore, the gate-drain parasitic capacitances, as shown in FIG. 4, can be obtained effectively, and thus, the uniform distribution of the common voltages required for the pixels, as shown in FIG. 5, can be obtained.

In above-explained embodiments, the pixels in general have substantially the same structures except for the structures of the TFTs. For example, the pixel electrodes may have the same area, and thus, the aperture ratios for the pixels may be the same. In addition, the semiconductor layer may be shifted along with the source and drain electrodes.

Further, in the above-explained embodiments, the source and drain electrodes are shifted upward and/or downward to adjust the parasitic capacitance. However, as long as the W/L ratios remain uniform, other structures of the TFTs may be adjusted to set the gate-drain parasitic capacitance instead of shifting the structures without departing from the scope of the present invention. For example, a width and/or a length of the drain electrode overlapping the gate electrode may be changed to adjust the gate-drain parasitic capacitance.

Further, in the above-described embodiments, the source electrode has the U-shape. However, as long as the W/L ratios remain uniform, other shapes of the source electrode adjusting the gate-drain parasitic capacitance may be applicable to the present invention.

As explained above, the gate-drain parasitic capacitances are adjusted to have values required according to the pixel positions such that the W/L ratios of the channels are substantially the same regardless of the pixel positions. Accordingly, the pixel voltage drops are adjusted to have values required according to the pixel positions. Therefore, the common voltages for normal pixel operation can be made substantially uniform such that flicker and afterimage cannot be perceived.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a first pixel including a first thin film transistor, the first thin film transistor having a first channel W/L (width/length) ratio and a first gate-drain parasitic capacitance;
   a second pixel including a second thin film transistor, the second thin film transistor being disposed at a different relative position than the first thin film transistor, the second thin film transistor having a second channel W/L (width/length) ratio and a second gate-drain parasitic capacitance; and
   a third pixel including a third thin film transistor, the third thin film transistor being disposed at a different relative position than the first and second thin film transistors, the third thin film transistor having a third channel W/L (width/length) ratio and a third gate-drain parasitic capacitance,
   wherein the first, second, and third channel W/L ratios are substantially the same, and the first gate-drain parasitic capacitance has a value between the second and third gate-drain parasitic capacitances in order that common voltages for normal operation of the first, second, and third pixels can be substantially the same, and
   wherein a gate electrode of each of the first to third thin film transistors is a portion of a gate line, wherein source and drain electrodes of the second thin film transistor are shifted along a width of the gate line with respect to a position of source and drain electrodes of the first thin film transistor, and wherein source and drain electrodes of the third thin film transistor are shifted opposite to the shifted direction of the source and drain electrodes of the second thin film transistor.

2. The device according to claim 1, wherein the second gate-drain parasitic capacitance is less than or more than the first gate-drain parasitic capacitance.

3. The device according to claim 1, wherein a difference between the first and second gate-drain parasitic capacitances corresponds to a difference of overlapping areas between gate and drain electrodes of the first and second thin film transistors.

4. The device according to claim 1, wherein a gate electrode of each of the first and second thin film transistors is a portion of a gate line, and the source and drain electrodes of the second thin film transistor are shifted along a width of the gate line with respect to the position of the source and drain electrodes of the first thin film transistor.

5. The device according to claim 4, wherein the source electrode of the second thin film transistor is shifted within the width of the gate line.

6. The device according to claim 1, wherein the source electrodes of the second and third thin film transistors are shifted within the width of the gate line.

7. The device according to claim 1, wherein a source electrode of each of the first and second thin film transistors has an U-shape, and a drain electrode of each of the first and second thin film transistors is extended toward an inner space of the U-shape.

8. The device according to claim 1, wherein the first and second pixels further include first and second pixel electrodes connected to the first and second thin film transistors, respectively, and wherein the first and second pixel electrodes have substantially the same area.

9. The device according to claim 1, wherein the first and second pixels are disposed at different positions along an extension direction of a gate line.

10. A liquid crystal display device, comprising:
    a plurality of pixels along a gate line; and
    a plurality of thin film transistors disposed in respective ones of the plurality of pixels, each thin film transistor having a channel W/L ratio and a gate-drain parasitic capacitance,
    wherein the W/L ratios of the plurality of thin film transistors are substantially the same, and the gate-drain parasitic capacitances of the plurality of thin film transistors have a non-uniform distribution in order that common voltages for normal operation of the plurality of pixels can be substantially the same,
    wherein a gate electrode of each of the plurality of thin film transistors is a portion of a gate line,
    wherein the plurality of thin film transistors includes first to third thin film transistors, and the gate-drain parasitic capacitance of the first thin film transistor has a value between the gate-drain parasitic capacitances of the second and third thin film transistors,
    wherein source and drain electrodes of the second thin film transistor are shifted along a width of the gate line with respect to a position of source and drain electrodes of the first thin film transistor, and wherein source and drain electrodes of the third thin film transistor are shifted opposite to the shifted direction of the source and drain electrodes of the second thin film transistor.

11. The device according to claim 10, wherein the distribution of the gate-drain parasitic capacitances has a convex shape along the gate line.

12. The device according to claim 10, wherein the distribution of the gate-drain parasitic capacitances corresponds to a distribution of overlapping areas between the gate and drain electrodes of the plurality of thin film transistors.

* * * * *